United States Patent
Iwade et al.

(10) Patent No.: US 8,796,541 B2
(45) Date of Patent: Aug. 5, 2014

(54) SOLAR CELL MODULE

(75) Inventors: Takashi Iwade, Otsu (JP); Toyoharu Terada, Otsu (JP); Naoyuki Atsuta, Otsu (JP); Masaaki Kawasugi, Otsu (JP)

(73) Assignee: Toray Engineering Co., Ltd., Tokyo (JP)

( * ) Notice: Subject to any disclaimer, the term of this patent is extended or adjusted under 35 U.S.C. 154(b) by 162 days.

(21) Appl. No.: 13/504,015

(22) PCT Filed: Feb. 8, 2011

(86) PCT No.: PCT/JP2011/052566
§ 371 (c)(1), (2), (4) Date: Apr. 25, 2012

(87) PCT Pub. No.: WO2011/102256
PCT Pub. Date: Aug. 25, 2011

(65) Prior Publication Data
US 2012/0204933 A1 Aug. 16, 2012

(30) Foreign Application Priority Data
Feb. 19, 2010 (JP) ................................. 2010-034482

(51) Int. Cl.
*H01L 31/0224* (2006.01)
*H01L 31/0352* (2006.01)
*H01L 27/142* (2014.01)
*B32B 37/22* (2006.01)
*H01L 31/05* (2014.01)

(52) U.S. Cl.
CPC ...... *B32B 37/226* (2013.01); *H01L 31/022466* (2013.01); *Y02B 10/12* (2013.01); *B32B 2367/00* (2013.01); *B32B 2457/12* (2013.01); *H01L 31/035281* (2013.01); *H01L 27/1427* (2013.01); *H01L 31/0504* (2013.01); *Y02E 10/50* (2013.01)

USPC ............................ 136/256; 136/244; 136/252

(58) Field of Classification Search
CPC ............... H01L 31/022466; H01L 31/035281; H01L 27/1427; H01L 31/0504; B32B 37/226; B32B 2367/00; B32B 2457/12; Y02B 10/12; Y02E 10/50
USPC .......................................... 136/244, 252, 256
See application file for complete search history.

(56) References Cited

U.S. PATENT DOCUMENTS

2008/0227236 A1* 9/2008 Luch .............................. 438/73
2008/0264484 A1* 10/2008 Temchenko et al. .......... 136/256

FOREIGN PATENT DOCUMENTS

JP 05-152593 A 6/1993
JP 11-261086 A 9/1999
(Continued)

OTHER PUBLICATIONS

International Search Report of corresponding International Application No. PCT/JP2011/052566, dated on Mar. 8, 2011.

*Primary Examiner* — Jayne Mershon
(74) *Attorney, Agent, or Firm* — Global IP Counselors, LLP

(57) ABSTRACT

In order to provide a see-through solar cell module in which the manufacturing costs can be reduced and transmittance can be readily modified without modifying the manufacturing steps, there is provided a solar cell module comprising solar cells in which are layered a conductive substrate, and a lower electrode layer, a photoelectric conversion layer, and an upper electrode layer in the stated order on the conductive substrate; the solar cell module having a configuration in which a plurality of through-openings that pass through the conductive substrate to the upper electrode layer in the layering direction is formed over the entire surface of the solar cells.

7 Claims, 4 Drawing Sheets

(56) References Cited

FOREIGN PATENT DOCUMENTS

| JP | 2002-299666 | A | 10/2002 |
|----|-------------|---|---------|
| JP | 2005-243675 | * | 9/2005 |
| JP | 2005-243675 | A | 9/2005 |
| JP | 2009-010355 | A | 1/2009 |
| WO | WO-03/072500 | A1 | 9/2003 |

* cited by examiner (a)

(b)

(c)

SOLAR CELL MODULE

CROSS-REFERENCE TO THE RELATED APPLICATIONS

This U.S. national phase application claims priority to Japanese Patent Application No. 2010-034482 filed on Feb. 19, 2010. The entire disclosure of Japanese Patent Application No. 2010-034482 is hereby incorporated herein by reference

BACKGROUND

1. Technological Field

The present invention relates to a solar cell module, and particularly to a see-through solar cell module having light-transmittivity.

2. Background Technology

Research on solar cells using amorphous silicon film has been progressing for some time and practical application is increasing. Solar cells are attached to roofs, walls, and other surfaces of houses, and are configured so as to be able to generate electricity by receiving sunlight in the solar cell modules. Such solar cell modules are formed by electrically linking individual solar cells or a plurality of solar cells, and are usually configured by layering a metal back electrode, an amorphous silicon film (photoelectric conversion layer), and a transparent electrode; and a glass substrate is provided on the transparent electrode as necessary. Sunlight is irradiated from the glass substrate side, whereby the sunlight is received by the amorphous silicon film via the glass substrate and the transparent electrode, and electricity is generated.

On the other hand, the use of window material or light-transmissive members is also being investigated as a form of use for solar cells, and research on light-transmissive solar cell modules (see-through solar cell modules) is also being pursued. Specifically, see-through solar cell modules are configured by forming a plurality of openings in a non-light-transmissive metal back electrode and an amorphous silicon film, as described in Patent Citation 1. Part of the external light is thus transmitted through the openings and then through the transparent electrode and the glass substrate, thereby ensuring natural illumination of the entire solar cell module.

Also proposed as another see-through solar cell module is one in which a plurality of photoelectric conversion segments is arranged at predetermined intervals from each other on a transparent substrate, as described in Patent Citation 2, in lieu of providing openings in the solar cell module. According to this configuration, part of the external light is transmitted from the gaps between the segments, whereby natural illumination can be ensured.

Japanese Laid-open Patent Publication No. 5-152593 (Patent Citation 1) is an example of the related art.

Japanese Laid-open Patent Publication No. 2002-299666 (Patent Citation 2) is an another example of the related art.

SUMMARY

Problems to be Solved by the Invention

However, in the abovementioned see-through solar cell module, there is a problem in that manufacturing costs are increased. Specifically, in well-known configurations in which openings are provided in the back electrode and the amorphous silicon film, the openings must be formed by an etching treatment or laser machining after the solar cell module is formed. Accordingly, problems arise in which manufacturing costs of the solar cell modules as such are increased because a separate step for forming openings is required after the well-known solar cell module is completed.

In addition, in the configuration in which the photoelectric conversion segments are arranged at predetermined intervals from each other on the transparent substrate, the size and arrangement of the photoelectric conversion segments must be changed to match the transmittance to be manufactured in a case in which solar cell modules having a variety of transmittances are to be manufactured. There is therefore a problem in that the manufacturing steps must be made to conform to the modification of the transmittance, and as a result, the cost of the solar cell module itself is increased.

An advantage of the present invention, which was perfected in order to solve the above-mentioned problems, is to provide a see-through solar cell module in which the cost of manufacturing a solar cell module can be reduced, and in which the manufacturing steps can be readily performed without modification, even when the transmittance is modified.

Means Used to Solve the Above-Mentioned Problems

Aimed at solving the above-mentioned problems, the present invention provides a solar cell module including solar cells in which are layered a conductive substrate, and a lower electrode layer, a photoelectric conversion layer, and an upper electrode layer in the stated order on the conductive substrate; the solar cell module characterized in that a plurality of through-openings that pass through the conductive substrate to the upper electrode layer in the layering direction is formed over the entire surface of the solar cells.

According to the solar cell module, a see-through solar cell can be obtained because through-openings that pass through the conductive substrate of the solar cells to the upper electrode layer in the layering direction are provided, whereby part of the external light is transmitted through the through-openings. In the solar cell module of the present invention, the cost of manufacturing the module can be reduced because the configuration has through-holes. Specifically, in the solar cell module of the present invention, solar cells are manufactured using a CVD device or the like to layer a lower electrode layer, a photoelectric conversion layer (amorphous silicon film), and an upper electrode layer in the stated order on a conductive substrate having through-holes that pass through in the thickness direction, and the solar cell module can be manufactured by electrically connecting a single solar cell or a plurality of solar cells. In other words, a solar cell module can be readily manufactured using the same steps as the steps for manufacturing an ordinary non-see-through solar cell module because through-openings are formed by layering various layers on a conductive substrate in which through-holes are formed. Specifically, when the lower electrode layer is layered on the conductive substrate in which through-holes are formed, the lower electrode layer is layered on the flat surface of the conductive substrate, but is not layered over the through-holes, and through-openings are formed in the lower electrode layer over the through-holes of the conductive substrate. In other words, openings in communication with the through-holes of the conductive substrate are formed in the lower electrode layer. In a similar fashion, the photoelectric conversion layer and the upper electrode layer are layered on the lower electrode layer, whereby through-openings that pass through the conductive layer to the upper electrode layer in the layering direction are formed in the position of the through-holes of the conductive substrate. In a case in which an ordinary solar cell module lacking the see-through function is manufactured, the lower electrode layer, the photoelectric conversion layer, and the upper electrode layer are thus layered on the conductive layer in which through-holes are not formed, but in the solar cell module of the present invention, a see-through solar cell module can be readily formed without requiring a new, separate step in order to add the see-through function because the see-through solar cell module is formed merely by using a conductive substrate in which through-holes are formed. Accordingly, manufacturing costs can be reduced in comparison with a case in which the solar cell module is formed first, and the openings are then formed by a laser or the like, as in well-known manufacturing methods. In addition, even in a case in which the transmittance is to be modified, it is possible to merely modify the opening ratio of the through-holes formed in the conductive substrate. Therefore, the transmittance can be readily modified because the size and arrangement of the photoelectric conversion segments are not required to be changed to correspond with the transmittance to be manufactured, as is the case in well-known methods. Accordingly, even in a case in which the transmittance is modified, the manufacturing costs can be reduced without requiring a modification to a new manufacturing method.

In addition, the solar cell module can be configured so that the conductive substrate is formed of a perforated metal.

According to this configuration, the manufacturing costs can be reduced in comparison with a case in which through-holes are formed on a flat-plate conductive substrate because a commercially-available perforated metal can be used as the conductive substrate.

The solar cell module can be configured so that an electrical connector for electrically connecting the solar cells to each other is formed on a surface of the upper electrode layer, and the through-openings are formed so that the ratio of the opening region per unit area increases in accordance with the distance from the electrical connector.

According to this configuration, a solar cell module can be obtained in which loss of generating efficiency is reduced even when through-openings are formed in the photoelectric conversion layer. In other words, the electric current generated by irradiating light on the photoelectric conversion layer flows to the electrical connector through the upper transparent electrode layer. For this reason, the distance the electric current flows through the upper transparent electrode layer is greater for the electric current generated in a region at a distance from the electrical connector than for the electric current generated in a region near the electrical connector. In other words, the distance for the electric current to flow against the resistance of the upper transparent electrode layer is increased for the electric current generated in a region at a distance from the electrical connector, and the generating efficiency is decreased in comparison with electric current generated near the electrical connector. Accordingly, a configuration is used in which the through-openings are formed so as to increase in size in accordance with the distance from the electrical connector, whereby the through-openings are formed in a region of reduced generating efficiency. Loss of generating efficiency can therefore be reduced in a case in which the opening ratio (light-transmittance ratio) of the entire solar cell module is the same.

Also possible is a configuration in which the plurality of solar cells are arrayed so that a part thereof overlaps another in the layering direction to form overlapping linking parts, and the plurality of solar cells are integrally formed in the overlapping linking parts by the conductive substrate and the upper electrode layer being electrically connected by the electrical connector.

According to this configuration, the manufacturing costs can be reduced for a case in which a large solar cell module is formed in comparison with a case in which a separate connecting member is used to link the solar cells to each other, because part of the solar cells are made to overlap each other and be electrically connected.

In addition, the solar cell module can be configured having a cover member for accommodating the plurality of solar cells, the cover member being formed of a light-transmissive flexible material, and the plurality of solar cells being integrally secured by the cover member in an orientation in which the overlapping linking parts are formed.

According to this configuration, a flexible configuration can be obtained for the entire solar cell module, and it is therefore possible to obtain a see-through solar cell module having excellent flexibility in comparison with a well-known configuration in which glass is used as the cover member. The solar cell module can thereby be disposed on a curved surface or a wall surface having a complicated shape, and the solar cell module can therefore be disposed on a window of a house, a carport roof, or the like on which solar cell modules could not be disposed.

Effect of the Invention

According to the solar cell module of the present invention, manufacturing costs can be reduced even for a see-through solar cell module, and transmittance can be readily modified without modifying the manufacturing steps.

DETAILED DESCRIPTION OF EXEMPLARY EMBODIMENTS

Figure 1:
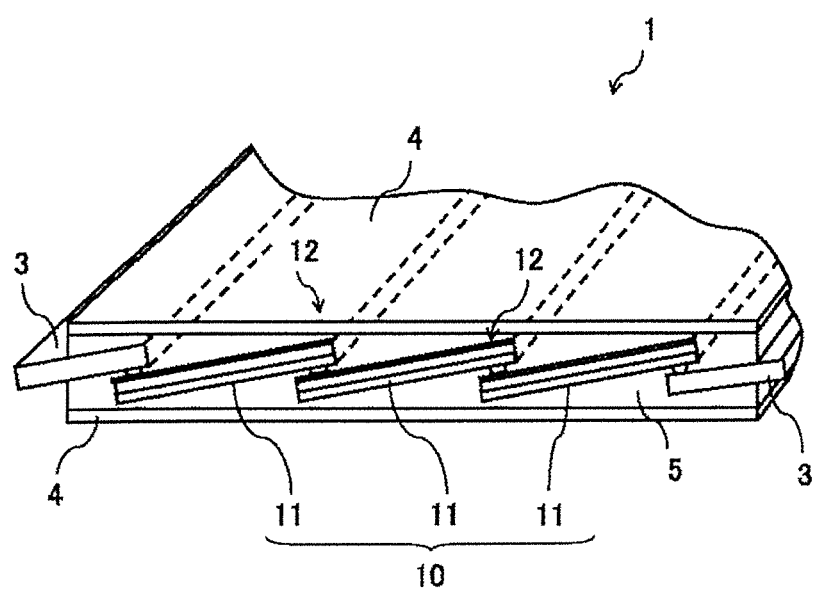
FIG. 1 is a schematic view showing a solar cell module according to the present invention.

Embodiments of a solar cell module according to the present invention will be described next. FIG. 1 is a schematic view showing a configuration of a solar cell module in the present embodiment, and FIG. 2 is an enlarged view of the main part of FIG. 1.

Figure 2:
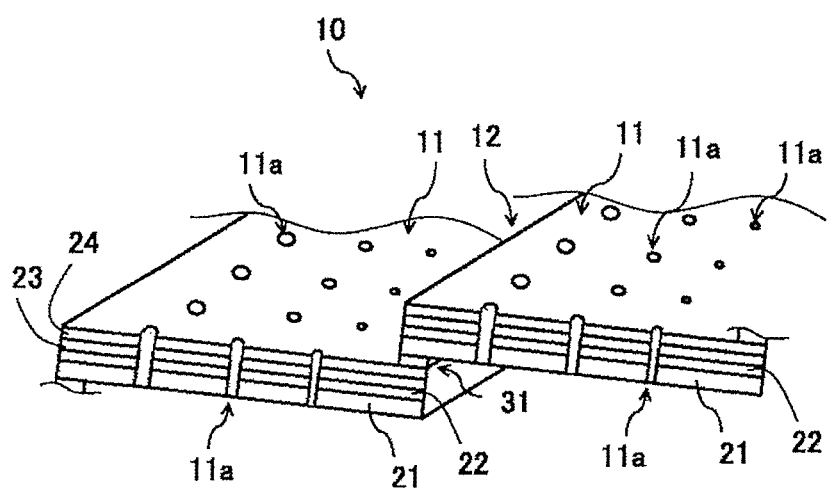
FIG. 2 is an enlarged view of the main part of FIG. 1.

As shown in FIGS. 1 and 2, a solar cell module 1 has a solar cell part 10 for generating an electric current from received light, an external electrode 3 connected to the two ends of the solar cell part 10, and a cover member 4 for covering part of the solar cell part 10 and the external electrode 3. The solar cell part 10 and the external electrode 3 are integrally formed by being held by the cover member 4 from both surfaces in a direction orthogonal to the array direction of the solar cell part 10 and the external electrode 3. Specifically, an EVA 5 (ethylene-vinyl acetate copolymer) is filled between the solar cell part 10, the external electrode 3, and the cover member 4; and part of the external electrode 3 is integrally formed in a projected state.

A plurality of solar cells 11 is arrayed in the example shown in FIG. 1 to form the solar cell part 10. Specifically, a plurality of rectangular solar cells 11 is arrayed in one direction to form the solar cell part 10, and the solar cells 11 are electrically connected to each other by overlapping linking parts 12. The external electrode 3 and the solar cells 11 arranged in the two end sections of the solar cell part 10 are electrically connected to each other in the two end sections of the solar cell part 10, and the electric current generated by the solar cell part 10 can be drawn out to the exterior from the external electrode 3. In other words, adjoining solar cells 11 in the overlapping linking parts 12 are arranged so as to partially overlap each other, and a conductive substrate 21 of one of the solar cells 11 and another upper electrode layer 24 are electrically connected to each other by a later-described electrical connector 31 (refer to FIG. 2). In other words, all of the arrayed solar cells 11 are linked in series, and the electric current generated by each of the solar cells 11 can be drawn out from the external electrode 3.

The solar cells 11 generate electricity by receiving sunlight or other light, and are formed by layering a conductive substrate 21, a lower electrode 22, a photoelectric conversion layer 23, and an upper electrode layer 24 in the stated order, as shown in FIG. 2. The solar cell module 1 of the present embodiment has a plurality of solar cells 11, the overlapping linking parts 12 are formed by partially overlapping the lengthwise sections of the adjacent solar cells 11 in the layering direction, and the adjacent solar cells 11 are electrically connected to each other by the electrical connector 31 of the overlapping linking parts 12. The "layering direction" herein refers to the direction in which the conductive substrate 21, the lower electrode layer 22, the photoelectric conversion layer 23, and the upper electrode layer 24 are layered. Sunlight or other light is received by the photoelectric conversion layer 23, whereupon electric current is generated by the photoelectric conversion layer 23 of each of the solar cells 11 and is made to flow through the upper electrode layer 24. The electric current then flows into the adjacent solar cell 11 via the electrical connector 31 provided on the upper electrode layer 24. These steps are repeated, whereby generated electric current is ultimately made to flow to the external electrode 3. The solar cells 11 are rectangular-shaped and have a lengthwise section and a widthwise section, and the widthwise dimension of the solar cells 11 is set to a permissible dimension for the generating capacity of the solar cells 11 even when affected by the internal resistance of the upper electrode layer 24 in a case in which the electric current generated by the photoelectric conversion layer 23 is made to flow through the upper electrode layer 24 to the electrical connector 31.

In addition, the solar cell 11 has a plurality of through-openings 11a, and reception of natural illumination on the entire solar cell module 110 (*1) can be ensured by transmitting part of the external light from the through-openings 11a. The through-openings 11a are formed through the conductive substrate 21, the lower electrode layer 22, the photoelectric conversion layer 23, and the upper electrode layer 24 in the layering direction. Specifically, through-holes are formed through the conductive substrate 21 in the thickness direction, and the through-openings 11a are formed in the position of the through-holes. Light on the upper electrode layer 24 can thereby be transmitted to the conductive substrate 21. The through-openings 11a are formed over the entire surface of the solar cells 11 in a predetermined ratio relative to the surface area of the solar cells 11 in accordance with the setting of the light-transmittivity for the solar cell module 1. Part of the external light on the upper electrode layer 24 is thereby transmitted through the through-openings 11a to the conductive substrate 21, and the scenery on the upper electrode layer 24 can be seen from the conductive substrate 21.

The through-openings 11a are formed in a substantially circular shape in cross section, and the diameter of the through-openings 11a is formed so as to increase in accordance with the distance from the electrical connector 31 on the upper electrode layer 24. The ratio of the opening region per unit area in the through-openings 11a is formed so as to increase in accordance with the distance from the electrical connector 31. In other words, the electric current generated by the photoelectric conversion layer 23 is made to through the upper electrode layer 24 and is therefore affected by the internal resistance of the upper electrode layer 24. The electric current generated in a region near the electrical connector 31 is scarcely influenced by internal resistance because the distance to flow through the upper electrode layer 24 is short, but the electric current generated in a region at a distance from the electrical connector 31 undergoes greater electrical loss than an electric current generated in a region near the electrical connector 31 because the distance to flow through the upper electrode layer 24 is great. Accordingly, solar cells 11 (solar cell module 1) having less electrical loss can be obtained by providing large-diameter though-openings 11a in regions at a distance from the loss-generating electrical connector 31 to obtain the same opening ratio for the entire surface, in comparison with a case in which through-openings 11a are uniformly provided over the entire surface of the solar cells 11 (solar cell module 1).

Figure 3:
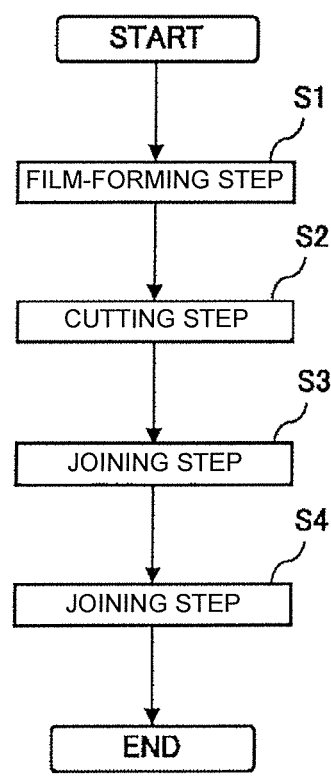
FIG. 3 is a flowchart showing the steps for manufacturing a solar cell module.
Figure 4:
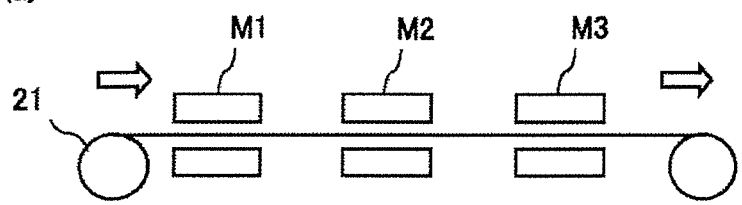
FIG. 4 is a schematic view showing the manufacturing steps of FIG. 3.
Figure 4:
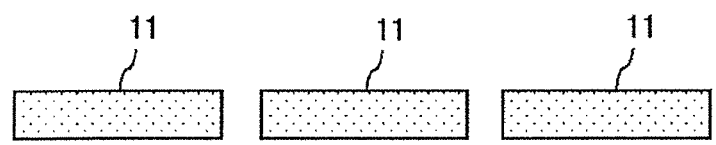
Figure 4:
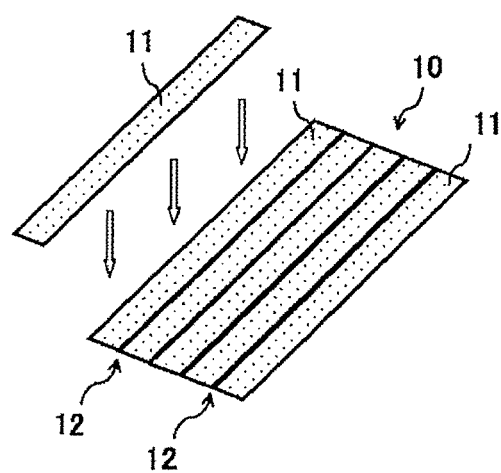

A method for manufacturing the solar cell module 1 will be described next. FIG. 3 is a flowchart showing the manufacturing steps, and FIG. 4 is a schematic view showing each of the steps.

A film-forming step is first performed in step S1. In other words, the lower electrode layer 22, the photoelectric conversion layer 23, and the upper electrode layer 24 are layered on the thin-plate conductive substrate 21. In the present embodiment, a substrate in which through-holes are formed in a flexible metal member in the form of a thin-plate, for example, a stainless steel perforated metal, is used as the conductive substrate 21. The conductive substrate 21 of the present embodiment is wound in a roll shape, and the width dimension is set as the widthwise dimension of the solar cells 11. Each of the layers is formed on the conductive substrate 21 by a manufacturing device provided with a feed-out machine and a winder, and a CVD device or the like for producing a film is provided therebetween, as shown in FIG. 4(a). In other words, the conductive substrate 21 wound into a roll shape is passed from the feed-out machine and through the CVD device or the like for forming the layers, and is wound onto the winder, whereby the layers are formed. Specifically, Ag and ZnO films are formed as the lower electrode layer 22 on the conductive substrate 21 by a device M1. The lower electrode layer 22 is thereby layered on the conductive substrate 21, but the lower electrode layer 22 is not formed on the through-holes of the conductive substrate 21. Openings in communication with the lower electrode layer 22 from the through-holes of the conductive substrate 21 are therefore formed in the lower electrode 22 in the position of the through-holes of the conductive substrate 21.

The lower electrode layer 22 is formed by the device M1, whereupon the conductive substrate 21 is wound up a predetermined amount, and the photoelectric conversion layer 23 is thereby formed on the lower electrode layer 22. In other words, an amorphous silicon film is formed as the photoelectric conversion layer 23 by a device M2 (CVD device). The photoelectric conversion layer 23 is thereby layered on the lower electrode layer 22, but the photoelectric conversion layer 23 is not formed on the through-holes of the conductive substrate 21. Openings in communication with the through-holes of the conductive substrate 21, the lower electrode layer 22, and the photoelectric conversion layer 23 are therefore formed in the photoelectric conversion layer 23 in the position of the through-holes of the conductive substrate 21.

The photoelectric conversion layer is formed by the device M2, whereupon the conductive substrate 21 is wound up a predetermined amount, and the upper electrode layer is thereby formed on the photoelectric conversion layer 23. In other words, an ITO film is formed as the upper electrode layer 24 by the device M3. The upper electrode layer 24 is thereby layered on the photoelectric conversion layer 23, but the upper electrode layer 24 is not formed on the through-holes of the conductive substrate 21. Openings (through-openings 11a) in communication with the through-holes of the conductive substrate 21, the lower electrode layer 22, the photoelectric conversion layer 23, and the upper electrode layer 24 are therefore formed in the upper electrode layer 24 in the position of the through-holes of the conductive substrate 21. Successively formed solar cells 11 in which the through-openings 11a are formed in the solar cells 11 can therefore be obtained in a wound state in the form of a roll.

A cutting step is performed next in step S2. In other words, the successively formed solar cells 11 obtained in the film-forming step are cut to predetermined dimensions. Specifically, rectangular solar cells 11 having widthwise and lengthwise sections can be obtained by cutting in accordance with the dimensions of the lengthwise sections of the solar cells 11 to be designed (FIG. 4(b)).

A joining step is performed next in step S3. In other words, a solar cell part 10 integrally formed by serially connecting a plurality of solar cells 11 to each other is obtained (FIG. 4(c)). Specifically, the adjacent solar cells 11 are integrally joined in a state in which the overlapping linking parts 12 are formed. In other words, a solder is secured as the electrical connector 31 to the end part of the upper electrode layer 24 of a single solar cell 11, and another solar cell 11 is mounted on the solder. The conductive substrate 21 is brought into contact with and temporarily secured to the solder on the upper electrode layer 24 by a jig. The solar cells 11 having two end sections disposed in the array direction are brought into contact with the external electrode 3 via the solder. The solar cells 11 are arranged in a furnace in the temporarily secured state, the temperature in the furnace is increased to the solder melting point or higher to thereby melt the solder, and the solder is furthermore cooled to the temperature of the hardening point, whereby the solar cells 11 are electrically connected to each other to form the solar cell part 10.

A laminating step is performed next in step S4. Specifically, the solar cell part 10 is held in a sandwich and integrally formed by the light-transmissive flexible cover member 4. Specifically, the solar cell part 10 is held from two sides in a direction orthogonal to the array direction of the solar cells 11 by a fluorine film, a PET film, or another light-transmissive film as the cover member 4, and is laminated in a state in which the EVA 5 is interposed therebetween. The solar cell part 10 can thereby be integrally formed in a state disposed within the cover member 4, and the solar cell module 1 (refer to FIG. 1) can be obtained.

The solar cell module 1 thus obtained can be a see-through solar cell because part of the external light is transmitted through the through-openings 11a. In the solar cell module 1 of the present invention, the cost of manufacturing the solar cell module 1 can be reduced by obtaining a configuration having the through-openings 11a. In other words, the manufacturing costs can be reduced in comparison with well-known manufacturing methods in which openings are formed by a laser or the like after the solar cell module 1 has been formed because the solar cell module 1 can be formed by layering the lower electrode layer 22, the photoelectric conversion layer 23, and the upper electrode layer 24 on the conductive substrate 21 in which through-holes are formed. In addition, even in a case in which the transmittance is to be modified, it is possible to merely modify the opening ratio of the through-holes formed in the conductive substrate 21. Therefore, the transmittance can be readily modified because the size and arrangement of the photoelectric conversion segments are not required to be changed to correspond with the transmittance to be manufactured, as is the case in well-known methods. Accordingly, even in a case in which the transmittance is modified, the manufacturing costs can be reduced without requiring a modification to a new manufacturing method.

In addition, the solar cell part 10 can be made flexible because the conductive substrate 21 is formed of a thin plate, and a part of the plurality of solar cells 11 is made to overlap each other. A see-through solar cell module 1 having excellent flexibility can therefore be obtained by providing a flexible cover member.

In the aforementioned embodiment, an example was described in which a stainless steel perforated metal is used as the conductive substrate 21, but the conductive substrate 21 can be a conductive flat plate member in which through-holes have been formed.

In addition, in the aforementioned embodiment, an example was described in which the through-hole openings 11a were formed so that the diameter increases in accordance with the distance from the electrical connector 31, but all of the through-openings 11a can have the same diameter, in which case, the manufacturing costs can be further reduced because all of the through-holes of the conductive substrate 21 have the same shape. In addition, as a configuration in which the opening region of the through-openings 11a is increased in accordance with the distance from the electrical connector 31, it is possible to use a mode in which the opening region sequentially increases in size in accordance with distance from the electrical connector 31, or a mode in which that the diameter of the through-openings 11a increases in a stepwise fashion, such as the opening region being formed with the same shape from the electrical connector 31 to a predetermined region, and the opening region being formed with a larger shape from the predetermined region to a region further distanced away. In addition, in a case in which the diameters of the through-openings 11a are all the same, the through-openings 11a in a region near the electrical connector 31 can be sparsely provided, and the though-openings 11a can be densely provided in accordance with the distance from the electrical connector 31. In other words, any mode can be used as long as the mode is such that the ratio (opening ratio) of the opening region per unit area in the region at a distance from the electrical connector 31 is larger than the ratio (opening ratio) of the opening region per unit area in the region near the electrical connector 31.

The invention claimed is:
1. A solar cell module comprising:
    first and second solar cells each including
        a conductive substrate,
        a lower electrode layer being disposed next to conductive substrate,
        a photoelectric conversion layer, and
        an upper electrode layer, with the photoelectric conversion layer being disposed between the lower electrode layer and the upper electrode layer;

a plurality of through-openings extending through the conductive substrate of the first solar cell to the upper electrode layer of the first solar cell; and an electrical connector electrically connecting the first and second solar cells, the electrical connector being disposed between a surface of the upper electrode layer of the first solar cell and a surface of the conductive substrate of the second solar cell, the through-openings being arranged on the first solar cell such that a ratio of opening region of the through-openings per unit area of the first solar cell increases as moving away from the electrical connector along the first solar cell.

2. The solar cell module according to claim 1, wherein the through-openings are formed by layering the lower electrode layer, the photoelectric conversion layer, and the upper electrode layer on the conductive substrate in a thickness direction.

3. The solar cell module according to claim 1, wherein the conductive substrates of the first and second solar cells are formed of a perforated metal.

4. The solar cell module according to claim 1, wherein the first and second solar cells are arrayed so that the first solar cell at least partially overlaps the second solar cell in a layering direction to form an overlapping linking part, and the first and second solar cells are integrally coupled relative to each other in the overlapping linking part by the electrical connector such that the upper electrode layer of the first solar cell is electrically connected to the conductive substrate of the second solar cell by the electrical connector.

5. The solar cell module according to claim 1, further comprising
a cover member accommodating the first and second solar cells, with the cover member being made of a light-transmissive flexible material, the first and second solar cells being integrally secured by the cover member in an orientation in which an overlapping linking part is formed.

6. The solar cell module according to claim 1, wherein the through-openings are arranged on the first solar cell in a pattern with the through-openings that are farther from the electrical connector having larger diameters relative to ones of the through-openings that are closer to the electrical connector such that the ratio of opening region of the through-openings per unit area of the first solar cell increases as moving away from the electrical connector along the first solar cell.

7. The solar cell module according to claim 1, wherein the through-openings that are farther from the electrical connector are more densely arranged with respect to each other relative to ones of the through-openings that are closer to the electrical connector such that the ratio of opening region of the through-openings per unit area of the first solar cell increases as moving away from the electrical connector along the first solar cell.

* * * * *